(12) United States Patent
Jones

(10) Patent No.: US 6,364,709 B1
(45) Date of Patent: Apr. 2, 2002

(54) SMALL FORM-FACTOR PLUGGABLE TRANSCEIVER CAGE

(75) Inventor: Dennis B. Jones, Orange, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/839,971

(22) Filed: Apr. 20, 2001

(51) Int. Cl.[7] .............................................. H01R 13/648
(52) U.S. Cl. ...................................... 439/607; 439/567
(58) Field of Search ................................ 439/607, 567, 439/92

(56) References Cited

U.S. PATENT DOCUMENTS

| | | | | |
|---|---|---|---|---|
| 6,135,790 A | * | 10/2000 | Huang et al. | 439/607 |
| 6,142,828 A | * | 11/2000 | Pepe | 439/607 |
| 6,165,014 A | * | 12/2000 | Kao et al. | 439/607 |
| 6,178,096 B1 | * | 1/2001 | Flickinger et al. | 361/816 |
| 6,203,336 B1 | * | 3/2001 | Nakamura | 439/607 |

* cited by examiner

*Primary Examiner*—Tho D. Ta
(74) *Attorney, Agent, or Firm*—Wei Te Chung

(57) ABSTRACT

A small form-factor pluggable metal cage has two sidewalls, a sidewall cover, a top plate, a soleplate and rear cover, which are made of a single piece of metal plate. Two types of legs extend from the cage, one being compliant type for extending through the board holes defined in a printed circuit board (PCB) and the other being piggy type abutting against the board. The compliant legs define two arc sections for stability and preventing the cage from disengaging from the PCB during the course of reflowing. The rear cover includes an inner panel extending from the second sidewall with a tab formed on a free end to engage a notch defined in the first sidewall. An outer panel extends from the top plate. The outer panel defines a slot for engaging a clasp of the inner panel. Two patches respectively extend from the sidewalls and are located above the inner panel.

8 Claims, 6 Drawing Sheets

SMALL FORM-FACTOR PLUGGABLE TRANSCEIVER CAGE

BACKGROUND OF THE INVENTION

1. Field of the Invention

The present invention relates to a small form-factor pluggable (SFP) optic transceiver module for fiber channel applications and, more particularly, to an optical transceiver module cage of high data transfer rate program GBIC.

2. The Related Art

Transceiver modules provide bi-directional transmission of data between an electrical interface and an optical data link. The module receives and converts electrically encoded data signals into optical signals which are then transmitted over the optical data link. Likewise, the module receives and converts optically encoded data signals into electrical signals and transmit the electrical signals in the electrical interface.

Normally, the transceiver module is mounted on a printed circuit board (PCB) assembly of a host computer, an input/output system, a peripheral device, or a switch. A small form-factor pluggable module connects with a metal cage assembly mounted on the PCB. The metal cage allows both ease of interconnection and ease of installation on PCB. The cage functions to dissipate electrostatics and serves as an electromagnetic shield.

The metal cage generally has two parallel sidewalls, a rectangular top, a rectangular bottom, and opposite ends. A conventional cage employs a two piece design. The two piece cage does not process a sufficient mechanical strength. Furthermore, the two piece design makes it difficult to manufacture and install the cage. In addition, the prior art cage forms legs for supporting the cage. However, no board locking mechanism is provided so that during the course of reflowing of a soldering process, the cage may inadvertently disengage from a PCB, causing poor soldering result.

SUMMARY OF THE INVENTION

To solve the problems of the prior art, the present invention provides a small form-factor pluggable metal cage employing a one-piece design and the cage of the present invention has two types of legs. The first type is compliant legs that can be assembled through a board. The second type is piggy legs which does not go through the board.

Accordingly, an object of the present invention is to provide a small form-factor pluggable metal cage having compliant legs, each defining an arc portion for preventing the cage from disengaging from a printed circuit board during the course of reflowing.

It is further object of the present invention is to provide a small form-factor pluggable metal cage that enhances assembly.

It is another object of the present invention to provide a metal cage of an optical transceiver having a one-piece structure which provides excellent mechanical stability.

It is still another object of the present invention to provide a metal cage structure of a small form-factor pluggable which enhances automated production and thus reduces costs of production.

Other objects, advantages and novel features of the present invention will be apparent from the following detailed description of preferred embodiments thereof with reference to the attached drawings, in which:

DETAILED DESCRIPTION OF THE PREFERRED EMBODIMENTS

Figure 1:
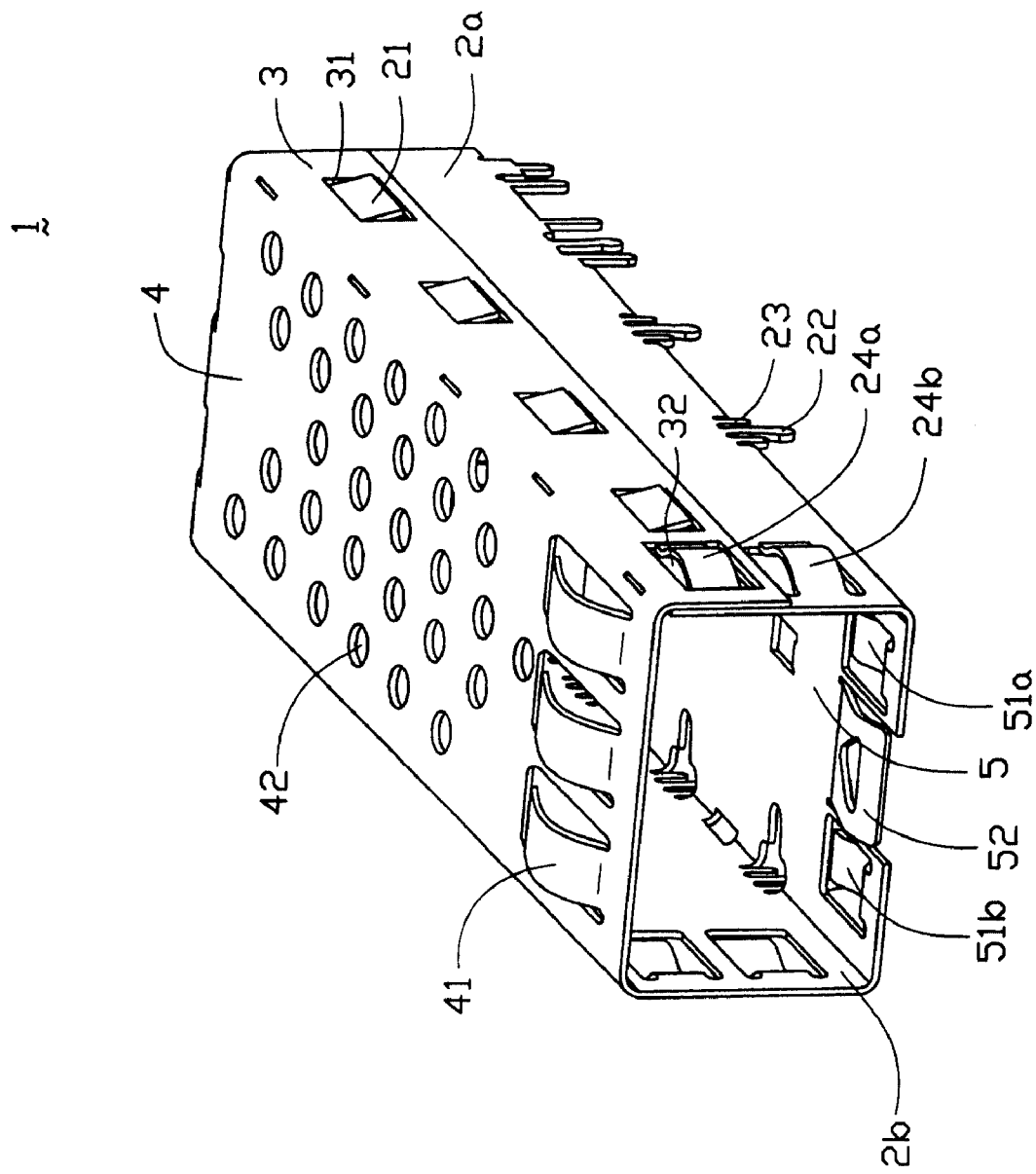
FIG. 1 is a perspective view of an optical transceiver cage constructed in accordance with the present invention.
Figure 2:
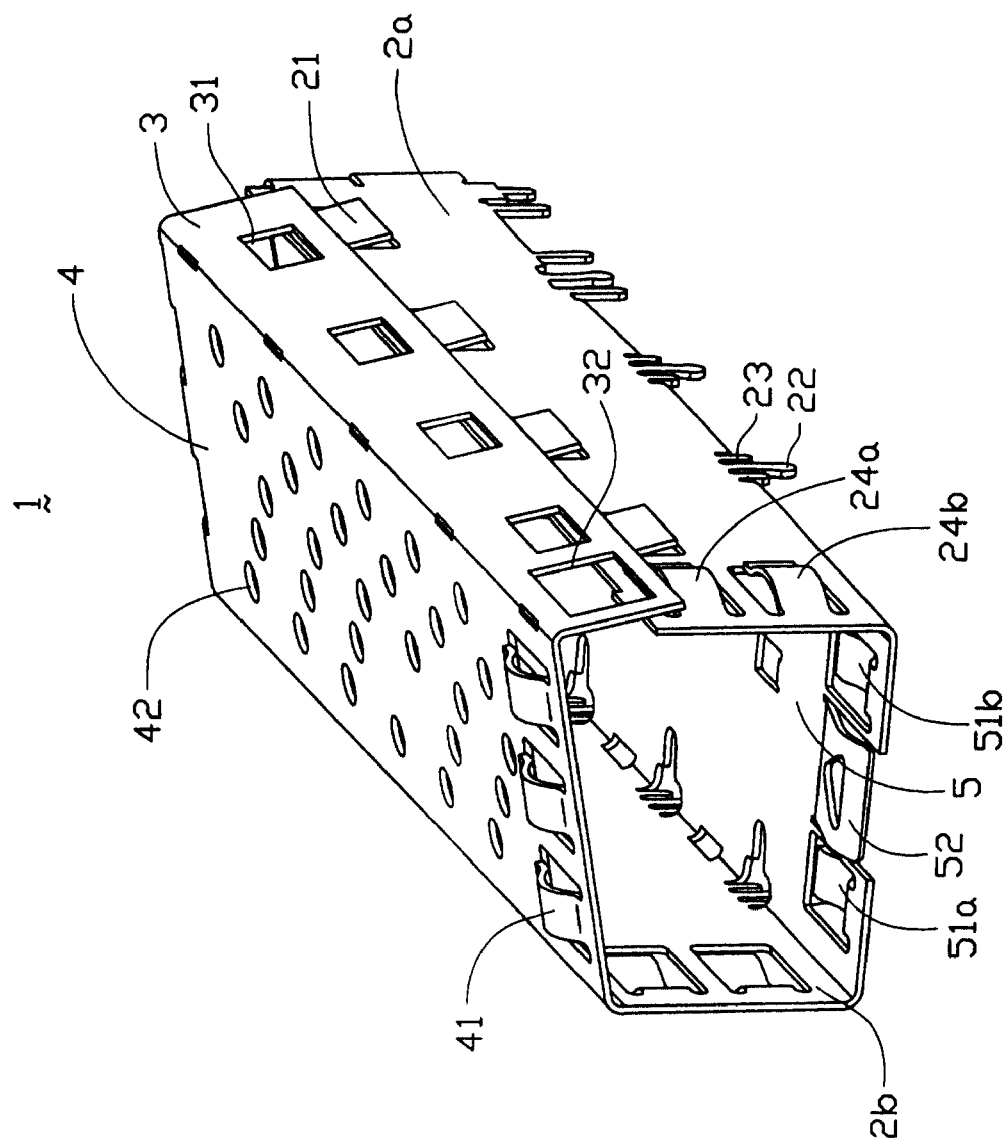
FIG. 2 is a perspective view of the optical transceiver cage of the present invention in a partially opened condition.
Figure 3:
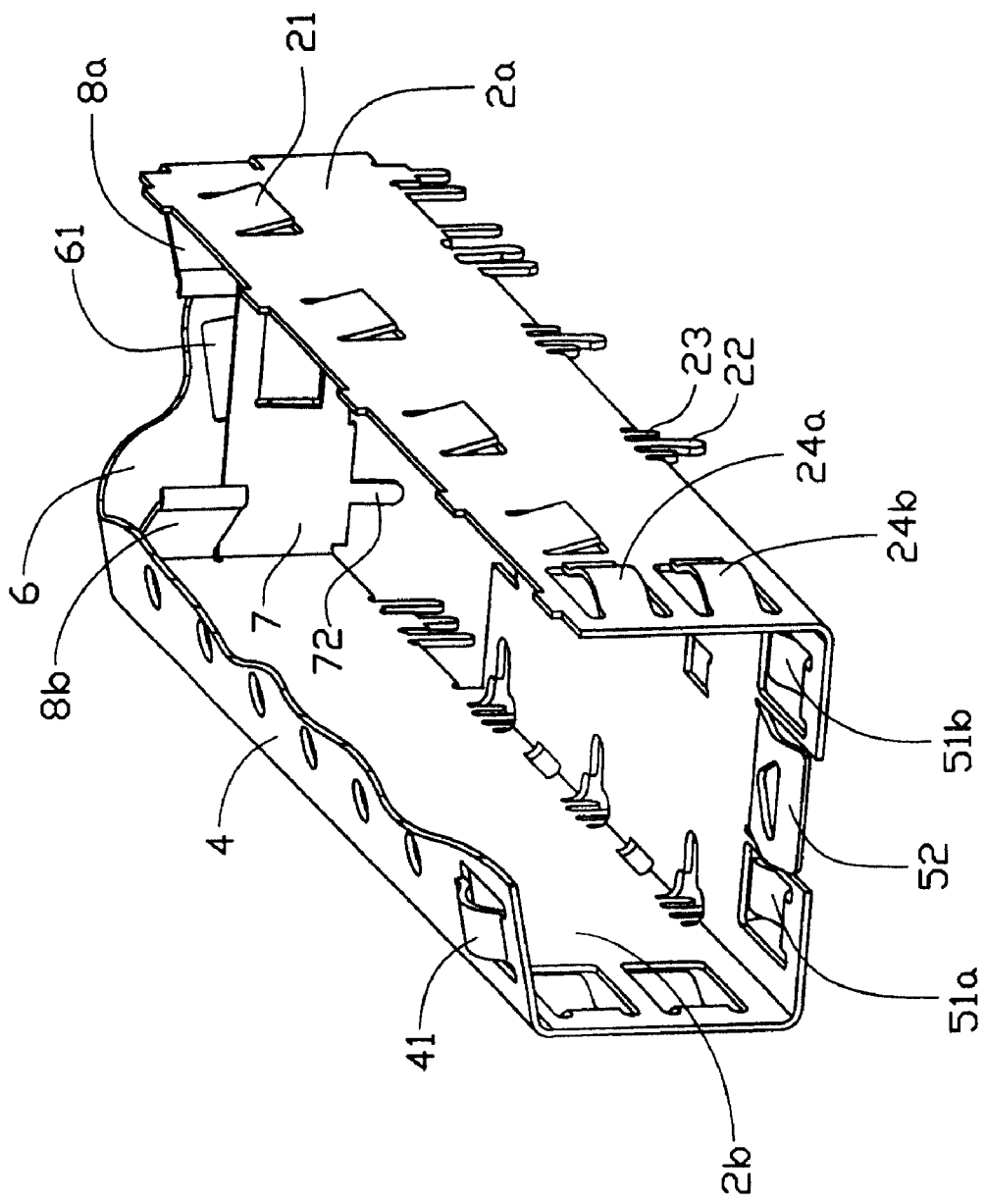
FIG. 3 is similar to FIG. 1 with a portion of the cage removed.

Referring to FIGS. 1–4, a small fact pluggable metal cage 1 in accordance with the present invention comprises a first sidewall 2a, a second sidewall 2b, a sidewall cover 3, a top plate 4, a soleplate 5, a rear cover including an outer panel 6 and an inner panel 7 and two bulge patches 8a and 8b which are made of a single piece of blank material, such as a metal plate. The one-piece structure adds additional strength stability as compared with a prior art two piece metal cage.

Figure 4:
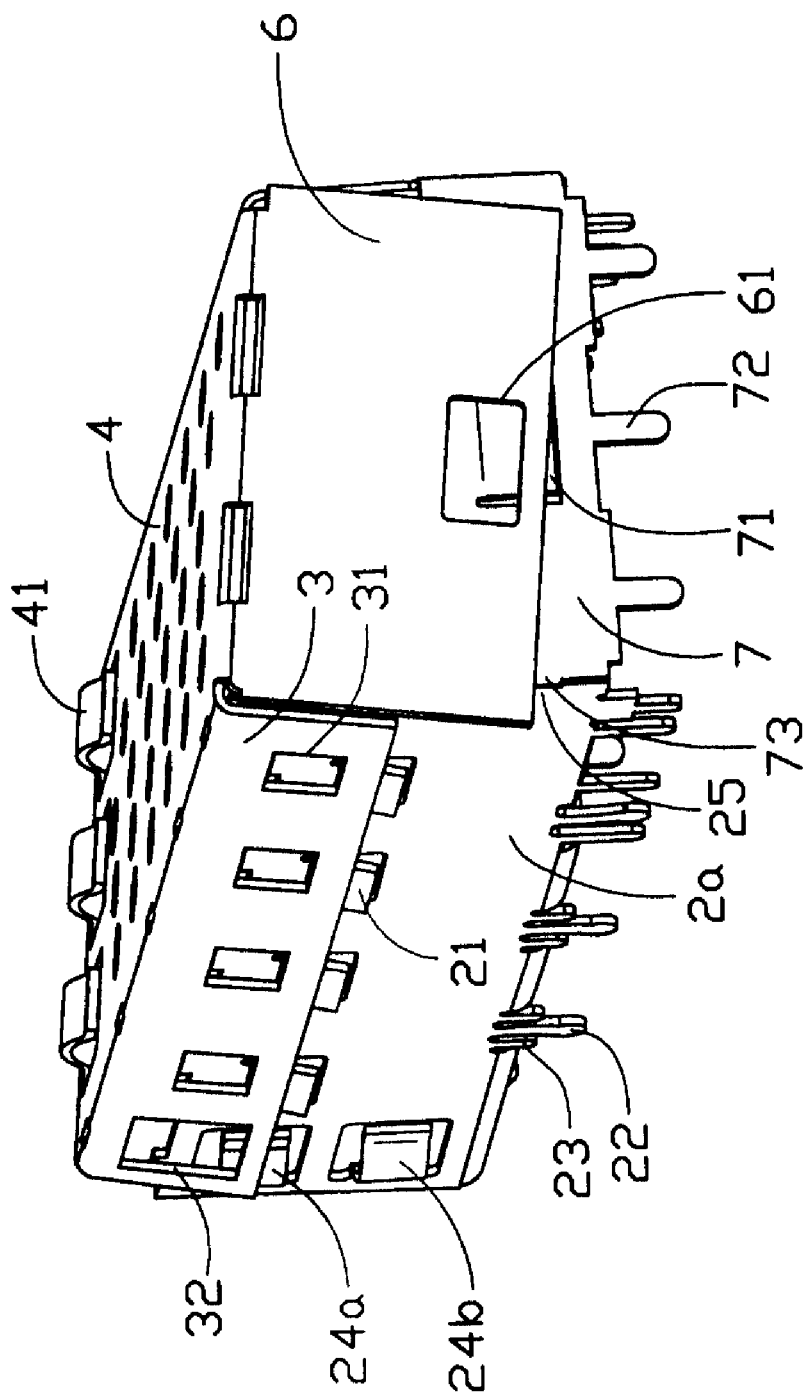
FIG. 4 is another perspective view of FIG. 2.

Each of the sidewalls 2a and 2b forms two spring tabs 24a, 24b proximate a front end thereof and a plurality of compliant legs 22 and piggy legs 23 at a lower edge thereof. The first sidewall 2a also forms a plurality of resilient clasps 21. A small notch 25 is defined in a rear edge of the first sidewall 2a (FIG. 4).

Figure 5:
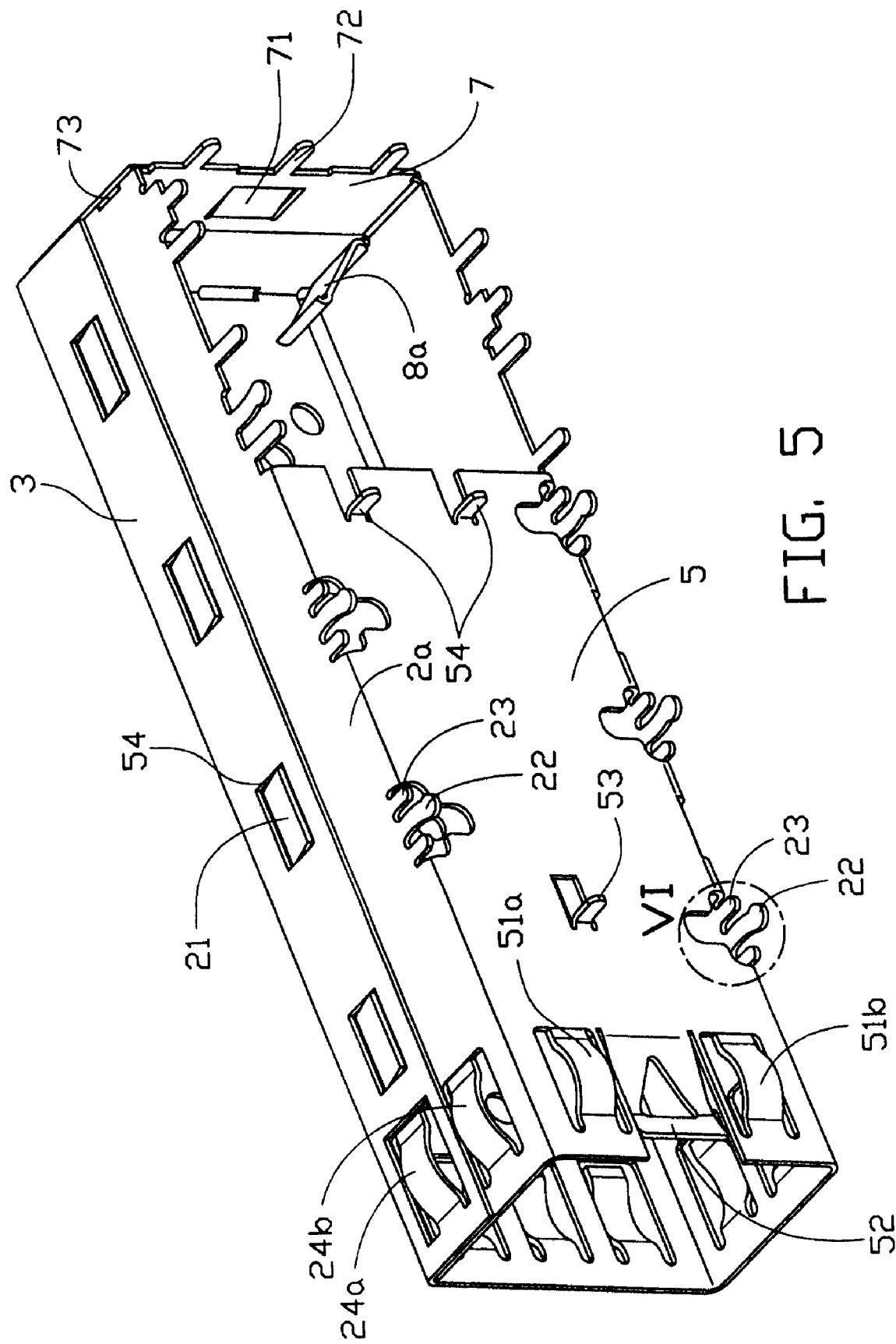
FIG. 5 is perspective view of FIG. 1.
Figure 7:
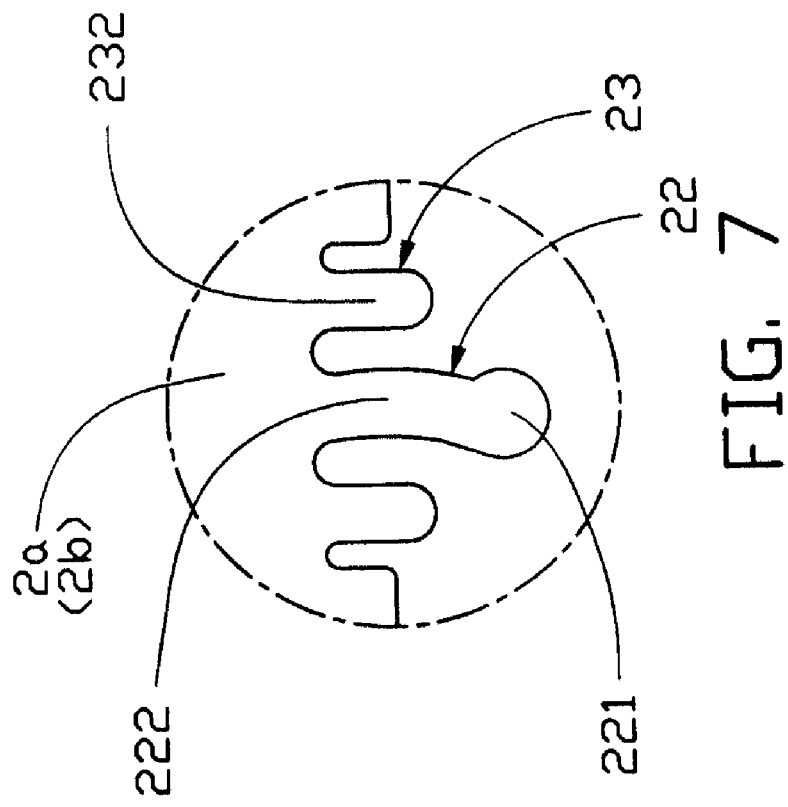
FIG. 7 is a side elevational view of a portion of a sidewall of the cage constructed in accordance with the present invention.
Figure 6:
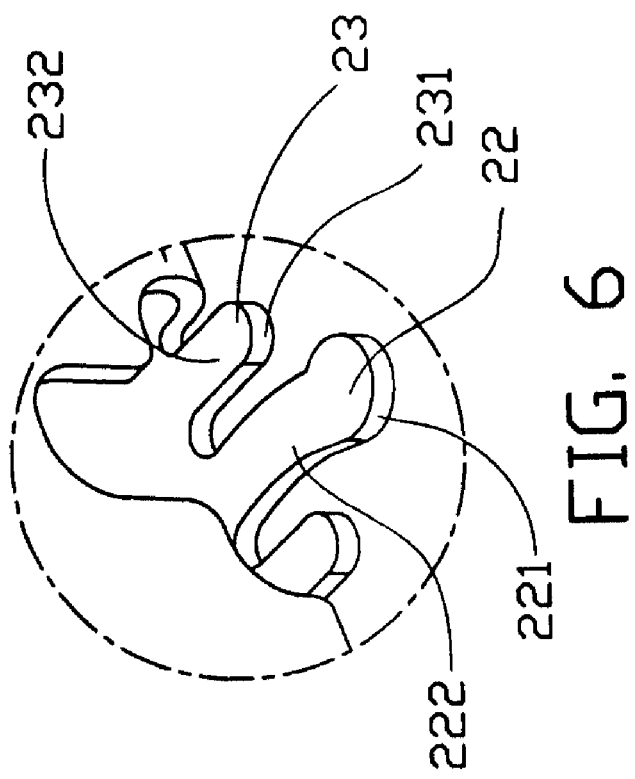
FIG. 6 is an enlarged view of encircled portion VI of FIG. 5 showing legs of the cage of the present invention.

Also referring to FIGS. 5, 6 and 7, in mounting the cage 1 to a printed circuit board (PCB, not shown), the compliant legs 22 extend through corresponding holes defined in the board whereas the piggy legs 23 do not. Each piggy leg 23 comprises an elongate body 232 having a rounded end 231. Each compliant leg 22 comprises an arcuate body 222 having a rounded end 221 substantially co-planar with the corresponding sidewall 2a, 2b whereby the rounded end 221 is offset with respect to a reference line in a first direction. The rounded end 221 is expanded so that it extends laterally beyond the body 222 in a second direction opposite to the first direction. The arcuate end 221, once engaging the corresponding hole of the PCB, help preventing the cage 1 from disengaging from the PCB during the course of reflowing. In the embodiment illustrated in FIG. 5, three compliant legs 22 are formed on each sidewall 2a, 2b and there are six compliant legs 22 in total among which three are offset in a direction away from the inner panel 7 of the rear cover of the cage 1, while the remaining compliant legs 22 are offset in a direction toward the inner panel 7 of the rear cover of the cage 1. The combination of compliant legs 22 offset in different directions enhances interferential engagement of the legs 22 with the corresponding holes of the PCB. Furthermore, the expanded ends 221 of the compliant legs 22 also serve as broad locks for securing the cage 1 on the board. The piggy legs 23 act as standoff separating the cage 1 from the PCB for enhancing soldering. The two types of legs make the metal cage 1 easy to connect to and install on a PCB.

Turning back to FIGS. 1–4, the top plate 4 forms spring tabs 41 at a front part thereof and defines a plurality of holes 42 at a rear portion. The sidewall cover 3 extends from the top plate 4 and overlaps the first sidewall 2a. The sidewall cover 3 defines openings 31, 32 for engaging the clasps 21 and the spring tab 24a of the first sidewall 2a, thereby securing the sidewall cover 3 to the first sidewall 2a, forming a parallelepiped cage.

The outer panel 6 of the rear cover extends from the top plate 4. A rectangular hole 61 is defined in the outer panel 6. The inner panel extends from the second sidewall 2b has a free end. Legs 72 extend from a lower edge of the inner panel 7. The inner panel 7 forms a resilient clasp 71 engaging the rectangular hole 61 of the outer panel 6. A tab 73 extends from the free edge of inner panel 7 opposite to the second sidewall 2b. The tab 73 engages the notch 25 of the first sidewall 2a, thus securing the first sidewall 2a and the outer panel 6 together. Patches 8a and 8b respectively extend from the first sidewall 2a and the second sidewall 2b are located above the inner panel 7.

Referring to FIG. 5, the soleplate 5 is shorter than the top plate 4 and forms a central inward tab 52 and two grounding tabs 51a and 51b on opposite sides of the central tab 52. A central leg 53 proximate the tab 52 and two legs 54 at a rear edge of the soleplate 5 extend from the soleplate 5, also serving as standoffs.

While there have been shown and described what are at present considered the preferred embodiment of the invention, it will be obvious to those skilled in the art that various changes and modifications may be made therein without departing by the scope of the invention as defined by the appended claims.

What is claimed is:

1. A small form-factor pluggable transceiver cage comprising:
    a top plate;
    a soleplate;
    a rear cover comprising an inner panel and an outer panel;
    a sidewall cover and two sidewalls, whereby the cage being made of a single piece of blank metallic material;
    wherein the inner panel extends from the second sidewall having a free end opposite the second sidewall, the outer panel extending from the top plate; and
    wherein two types of legs extending out of the lower edge of the sidewalls, one being compliant leg adapted to extent through a printed circuit board, and the other being piggy leg adapted to abut against printed circuit board.

2. The cage as described in claim 1, wherein at least one of the compliant legs comprises first and second arc portions, the curvature of the first arc portion being greater than the curvature of the second arc portion.

3. The cage as described in claim 2, wherein the second arc portions of the compliant legs being selectively bent toward or away from the rear cover.

4. A one-piece small form pluggable transceiver metal cage comprising:
    a top plate;
    a soleplate;
    a rear cover structure;
    a sidewall cover; first sidewall and second sidewall,
    wherein the rear cover structure comprises an inner panel and an outer panel and two bulge patches for grounding;
    wherein the inner panel extends from the second sidewall having a free end opposite the second sidewall, the outer panel extending from the top plate;
    wherein the first sidewall defines a notch in a rear edge thereof, a projection extending from the free end of the inner panel engaging the notch to fix the inner panel to the first sidewall; and
    wherein the inner panel forms a resilient clasp and the outer panel defines a rectangular hole for engaging the resilient clasp.

5. The cage as described in claim 4, wherein the inner panel forms a plurality of legs extending from a lower edge thereof.

6. A one-piece pluggable transceiver metal cage comprising:
    a top plate;
    a soleplate opposite to said top plate in a parallel relation therebetween; first and second mutually parallel sidewalls positioned between said top plate and said soleplate, said first sidewall integrally connected to both said top plate and said soleplate while said second sidewall integrally connected only to the soleplate;
    a sidewall cover downwardly extending from one edge of said top plate and at least partially overlapping said second sidewall; and
    a rear cover including inner and outer panels, said inner panel laterally integrally extending from a rear edge of one of said first and second sidewalls toward the other of said first and second sidewalls, and at a distal free end of said inner panel abutting against said other of said first and second sidewalls, said outer panel downwardly integrally extending from a rear edge of said top plate and at least partially overlapping said inner panel.

7. The cage as described in claim 6, wherein said soleplate defines an opening around a rear portion thereof so that a rear edge of the soleplate is far spaced from the rear cover.

8. The cage as described in claim 6, further including means for combining the inner panel and the outer panel, and means for combining the sidewall cover and the second sidewall.

* * * * *